(12) United States Patent
Kim et al.

(10) Patent No.: US 7,700,437 B2
(45) Date of Patent: Apr. 20, 2010

(54) NON-VOLATILE MEMORY DEVICE WITH BURIED CONTROL GATE AND METHOD OF FABRICATING THE SAME

(75) Inventors: Ki-chul Kim, Suwon-si (KR); Geum-jong Bae, Incheon Metropolitan (KR); In-wook Cho, Yongin-si (KR); Byoung-jin Lee, Seoul (KR); Jin-hee Kim, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 71 days.

(21) Appl. No.: 12/183,553

(22) Filed: Jul. 31, 2008

(65) Prior Publication Data

US 2008/0286927 A1     Nov. 20, 2008

Related U.S. Application Data

(62) Division of application No. 11/248,691, filed on Oct. 12, 2005, now Pat. No. 7,420,243.

(30) Foreign Application Priority Data

Dec. 24, 2004  (KR)  ..................... 10-2004-0112200

(51) Int. Cl.
*H01L 21/8247*   (2006.01)

(52) U.S. Cl. .............................. 438/259; 257/E21.179; 438/954; 438/286

(58) Field of Classification Search ......... 438/257–267, 438/954, 286; 257/E21.179
See application file for complete search history.

(56) References Cited

U.S. PATENT DOCUMENTS

| 4,796,228 A | 1/1989 | Baglee |
| 4,975,383 A * | 12/1990 | Baglee ....................... 438/258 |
| 2002/0071315 A1 | 6/2002 | Hsu et al. |

FOREIGN PATENT DOCUMENTS

| JP | 2003-188289 A | 7/2003 |
| KR | 10-2004-0063331 A | 7/2004 |

* cited by examiner

*Primary Examiner*—Richard A. Booth
(74) *Attorney, Agent, or Firm*—Mills & Onello, LLP

(57) ABSTRACT

In a non-volatile memory device with a buried control gate, the effective channel length of the control gate is increased to restrain punchthrough, and a region for storing charge is increased for attaining favorably large capacity. A method of fabricating the memory device includes forming the control gate within a trench formed in a semiconductor substrate, and forming charge storing regions in the semiconductor substrate on both sides of the control gate in a self-aligning manner, thereby allowing for multi-level cell operation.

16 Claims, 4 Drawing Sheets

NON-VOLATILE MEMORY DEVICE WITH BURIED CONTROL GATE AND METHOD OF FABRICATING THE SAME

This application is a divisional of U.S. application Ser. No. 11/248,691, filed on Oct. 12, 2005, which relies for priority upon Korean Patent Application No. 2004-0112200, filed on Dec. 24, 2004, in the Korean Intellectual Property Office, the disclosure of which is incorporated herein in its entirety by reference.

BACKGROUND OF THE INVENTION

1. Field of the Invention

The present invention relates to a semiconductor device and a method of fabricating the same, and more particularly, to a non-volatile memory device allowing for multi-level cell operation and a method of fabricating the same.

2. Description of the Related Art

Non-volatile memory device, such as Electrically Erasable Programmable ROMs (EEPROMs) and flash memory devices, maintain the integrity of data stored in a memory cell irrespective of whether a supply of electric power is removed from the device. In contemporary systems, there is a continued progression from the use of optical disc or magnetic disc storage systems to the use of semiconductor device based storage. There is thus an increased need for flash memory based storage units. In such a flash memory unit, data is typically stored in a floating gate. Recently, however, a nitride layer has been employed as a charge trapping layer in a flash memory device with a Metal Oxide Nitride Oxide Silicon (MONOS) structure or a Silicon Oxide Nitride Oxide Silicon (SONOS) structure.

As the packing density of the flash memory devices continues to increase, studies have been carried out on the formation of a control gate within a semiconductor substrate. One example of this is provided in U.S. Patent Application Publication No. 2002-0071315, published Jun. 13, 2002, and entitled "Non-volatile Memory having embedded word lines".

SUMMARY OF THE INVENTION

The present invention provides a non-volatile memory device having a control gate buried within a semiconductor substrate that is favorable for attaining high capacity, and having self-aligned charge trapping layers on both sides thereof to restrain punchthrough.

The present invention also provides a method of fabricating a non-volatile memory device having a control gate buried within a semiconductor substrate that is favorable for attaining high capacity, and having self-aligned charge trapping layers on both sides thereof to restrain punchthrough.

According to one aspect of the present invention, there is provided a non-volatile memory device with a buried control gate including a semiconductor substrate. A control gate is disposed within a trench formed in the semiconductor substrate. Source/drain regions are spaced apart form the control gate by a distance and are provided in the semiconductor substrate on both sides of the control gate. A tunnel oxide layer, a charge trapping layer and a blocking layer are provided on the semiconductor substrate, and a word gate is provided on the blocking oxide layer over the control gate.

According to another aspect of the present invention, there is provided a non-volatile memory device with a buried control gate including a semiconductor substrate. A control gate is disposed within a trench formed in the semiconductor substrate, and a drain region is formed in the semiconductor device spaced apart from a side of the control gate by a distance. A source region is formed in the semiconductor device adjacent another side of the control gate. A tunnel oxide layer, a charge trapping layer and a blocking oxide layer are provided on the semiconductor substrate and the control gate. A word gate is formed on the blocking oxide layer over the control gate.

In one embodiment, a channel oxide layer may be formed between the semiconductor substrate and the control gate, and a metal layer for preventing reverse programming may be further formed on the channel oxide layer.

In another embodiment, the metal layer for preventing reverse programming may be composed of a material selected from TiN and TaN.

In another embodiment, the prescribed distance between the control gate and the source/drain regions is determined by a width of a spacer formed at a side of the control gate when forming the control gate.

In another embodiment, the tunnel oxide layer may be a single layer comprising a material selected from a group consisting of SiN, SiON and high dielectric constant oxide, or a multiple layer including any one of the group. At this time, the high dielectric constant oxide may be any one material selected from a group consisting of Al oxide, Zr oxide, Hf oxide and La oxide, which includes nitrogen as a layer constituent.

In another embodiment, the charge trapping layer may be a single layer comprising of a material selected from a group consisting of SiN, oxide, SiON and high dielectric constant oxide, or a multiple layer including any one of the group. Moreover, The charge trapping layer may have a sandwiched structure where SiN and high dielectric constant oxide including nitrogen are alternately stacked by at least once.

In another embodiment, the blocking oxide layer may be a multiple layer including any one material layer selected from a thermal oxidation layer, an $N_2O$ annealed CVD oxide layer, and an insulating layer composed of SiON. Furthermore, a nitride region for controlling a threshold voltage may be added in the semiconductor substrate separated by the distance between the control gate and the source/drain regions.

In another embodiment, the word gate may be a single layer composed of a material selected from a group consisting of polysilicon, TaN, NiTa, Ti, TiN, W, WN, Hf, Mo, Ir, Pt, Co, Cr, $RuO_2$ and $Mo_2N$, or a multiple layer including any one of the group.

In another embodiment, the memory cell of the non-volatile memory device with the buried control gate performs multi-level cell operation that is controlled by allowing the cell state to have at least two states, for example, using the programming time. The cell state is any one of an erase threshold voltage, a medium range threshold voltage and a high range threshold voltage.

According to another aspect of the present invention, there is provided a method of fabricating a non-volatile memory device having a buried control gate including sequentially stacking a first oxide layer, a first nitride layer and a disposable oxide layer on a semiconductor substrate. After patterning the semiconductor substrate with the disposable oxide layer thereon to form a trench by partially etching the semiconductor substrate, a channel oxide layer is formed within the trench. A polysilicon layer is deposited on the channel oxide layer by filling the trench and is then planarized. A spacer is formed using a disposable oxide layer along the side of the polysilicon layer, and source/drain regions are formed in the semiconductor substrate via ion implanting, using the spacer as a mask. Then, the spacer, an upper portion of the polysilicon layer, the first nitride layer and the first oxide layer disposed on the semiconductor substrate are removed. A tunnel oxide layer, a charge trapping layer, and a blocking oxide layer are sequentially formed on the semiconductor substrate and a remaining portion of the polysilicon layer comprising the control gate. Finally, a word gate is formed on the blocking oxide layer.

According to a second aspect of the present invention, there is provided a method of fabricating a non-volatile memory device with a buried control gate including sequentially stacking a first oxide layer, a first nitride layer and a disposable oxide layer on a semiconductor substrate. Then, the semiconductor substrate with the disposable oxide layer thereon is patterned to form a trench by partially etching the semiconductor substrate, and a channel oxide layer is formed within the trench. After depositing a polysilicon layer for a control gate on the channel oxide layer by filling the trench and planarizing the polysilicon layer, a spacer is formed using the disposable oxide layer at a side of the polysilicon layer. Thereafter, source/drain regions are formed in the semiconductor substrate via ion implanting, using the spacer as a mask. The spacer, an upper portion of the polysilicon layer and the first nitride layer disposed on the semiconductor substrate are removed. Then, a photoresist layer is deposited on the drain region, and the source region is ion-implanted to be adjacent to the polysilicon layer for the control gate. After removing the first oxide layer, a tunnel oxide layer, a charge trapping layer, and a blocking oxide layer are sequentially formed on the semiconductor substrate, and a remaining lower portion of the polysilicon layer comprising the control gate. Finally, a word gate is formed on the blocking oxide layer thereon.

In one embodiment, after forming the channel oxide layer within the trench, a metal layer for preventing reverse programming may be formed on the channel oxide layer. Also, after the removing the first oxide layer, $N_2$ annealing or ion-implanting for controlling a threshold voltage may be performed on a region of the semiconductor substrate between the control gate and the source/drain regions. Here, $N_2$ annealing or ion-implanting for controlling a threshold voltage of the cell is for lowering the threshold voltage, for example, from a range of 1.5~1.8 volts to 1 volt, or less.

In another embodiment, after the forming the word gate, the polysilicon layer for the control gate is connected to the word gate.

In another embodiment, removing the polysilicon layer for the control gate is performed so that the remaining lower portion of the polysilicon layer for the control gate has a prescribed height above an upper surface of the semiconductor substrate, for example, the height of the remaining lower portion that lies above the surface of the semiconductor substrate is less than half of a height of a portion of the polysilicon layer that is buried in the trench.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings. The invention may, however, be embodied in many different forms and should not be construed as being limited to the embodiments set forth herein.

First Embodiment

2-Bit Non-Volatile Memory Device

Figure 6:
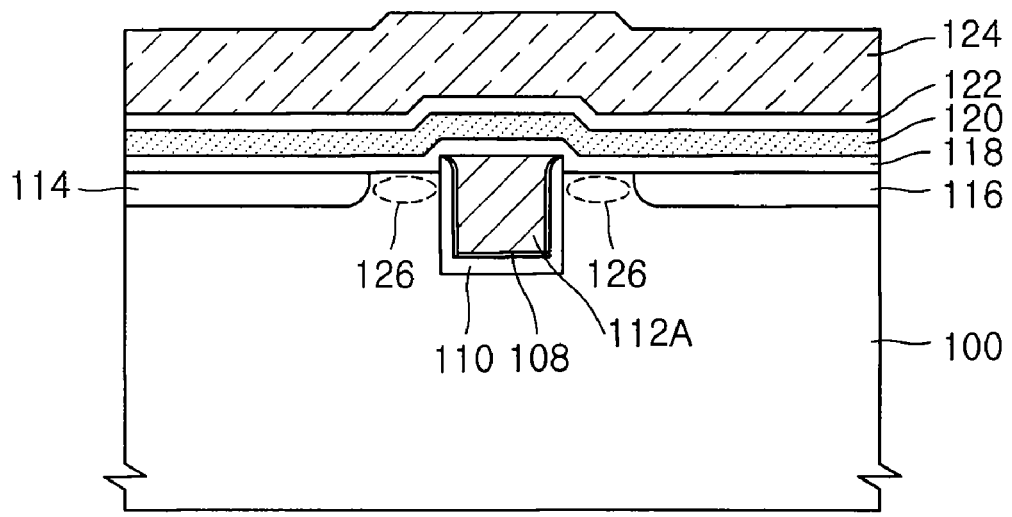

With reference to FIG. 6, a structure of a non-volatile memory device with a buried control gate according to a first embodiment of the present invention will be described.

The non-volatile memory device includes a semiconductor substrate 100 with a device isolating region (not shown), and a control gate 112A disposed within a trench that is formed in the semiconductor substrate 100. Source/drain regions 116/114 are disposed in the semiconductor substrate 100 by being spaced apart from each other by a prescribed distance (D of FIG. 4) on both sides of the control gate 112A. Also, a tunnel oxide layer 118, a charge trapping layer 120 and a blocking oxide layer 122 cover the semiconductor substrate 100. A word gate 124 is formed on the blocking oxide layer 122 and is oriented so as to pass over the control gate 112A.

Furthermore, a channel oxide layer 110 may be provided between the trench and the control gate 112A composed of polysilicon, and a metal layer 108 for preventing a reverse program phenomenon from occurring may be disposed on the channel oxide layer 110. The reverse program preventing layer 108 is a thin film composed of either one of TiN and TaN to a thickness of 200 Å or less, thereby inhibiting generation of a reverse program when performing a program operation on a memory cell.

Nitride regions or impurity regions 126 for controlling a threshold voltage under the tunnel oxide layer 118 may be formed in the semiconductor substrate 100 between the control gate 112A and the source/drain regions 116/114. The threshold voltage controlling nitride region 126 denotes a region formed by $N_2$ annealing for making a threshold voltage of a transistor in the memory cell having an initial voltage of 1.5~1.8 volts reduce to below 1 volt. Instead of forming the impurity region with nitride, an ion such as phosphorus (P) and Arsenic (As) with an impurity density lower than those of the source/drain regions 114/116 may be implanted to form the impurity region 126. At this time, the ion may be implanted to make the threshold voltage of the transistor in the memory cell having an initial voltage of 1.5~1.8 volts reduce to below 1 volt, similar to the result from formation of the nitride region. By forming the nitride region or impurity region 126, endurance characteristics of the memory cell can be improved.

The memory cell may be more stably operated by modifying the metal interconnection operation when the metal interconnection is performed over the word gate 124 in such a manner that the control gate 112A is connected to the word gate 124.

Subsequently, referring to FIG. 6, a method of operating the non-volatile memory device with the buried control gate according to the first embodiment of the present invention will be described.

When programming the memory cell, the source region 116 is supplied with 5 volts, the control gate 112A is supplied with 1.5 volts, and the word gate 124 is supplied with 5 volts. Then, a bit-line connected to the drain region 114 is grounded or supplied with a voltage 1 volt or less, thereby programming a charge in the charge trapping layer 120 using Channel Hot Electron Injection (CHEI).

A read operation in the memory cell may be embodied in two ways. In a first approach, the source region 116 is grounded, the control gate 112A is supplied with 1.5 volts, and the word gate 124 is supplied with 3 volts. Then, the bit-line connected to the drain region 114 is supplied with 0.6~0.8 volts, thereby reading out information with respect to the memory cell. In a second approach, the source region 116 is supplied with 0.6~0.8 volts, the control gate 112A is supplied with 1.5 volts, and the word gate 124 is supplied with 3 volts. Then, the bit-line connected to the drain region 114 is grounded, thereby reading out the contents of the memory cell.

An erase operation with respect to the memory cell may also be embodied in two ways. in a first approach that utilizes Hot Hole Erasing, the word gate 124 is supplied with −5 volts, and the source region 116 is supplied with a voltage higher than 5 volts, the contents with respect to the memory cell may be erased. In a second approach, a Fowler-Nordheim method is utilized in which the word gate 124 is supplied with a voltage of −8~−12 volts, and the source/drain regions 116/114 are grounded or floated, thereby erasing the contents of the memory cell.

In a typical flash memory device, the threshold voltage of the memory cell has two states of high or low. However, the states of the threshold voltage may be more than two in number. That is, multi-level cell operation can be performed that allows the program state of the charge trapping layer 120 to be three, in proportion to the quantity of charge that is stored in the charge trapping layer 120 after passing through the tunnel oxide layer 118 when programming.

The multi-level cell operation allows the programming states to be three when programming, e.g., a threshold voltage in an erased state (erase Vth), a threshold voltage in a medium state (medium range Vth), and a threshold voltage in a high state (high range Vth). In one example, the threshold voltages of foregoing three states may be applied to the non-volatile memory device in values of 1.5V/3V/5V. By doing so, much more information can be stored in a unit memory cell, which is favorable for attaining a high-capacity non-volatile memory device.

Hereinafter, a method of fabricating the non-volatile memory device with the buried control gate according to the first embodiment of the present invention will be described.

Figure 1:
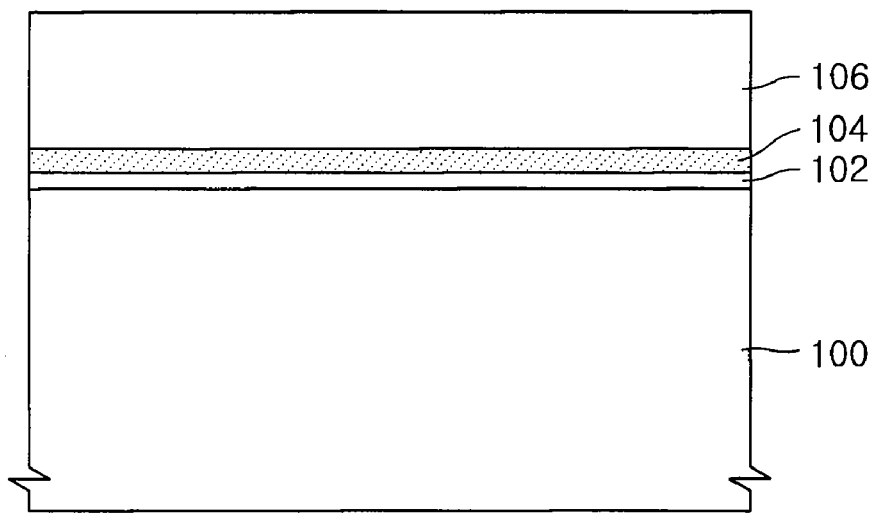
FIGS. 1 through 6 are sectional views of a non-volatile memory device having a buried control gate and a method of fabricating the same according to a first embodiment of the present invention.

Referring to FIG. 1, a first oxide layer 102 is formed on the semiconductor substrate 100 to a thickness of 100 Å or less. Then, a first nitride layer 104 is deposited to a thickness of 200 Å or less on the first oxide layer 102 over the semiconductor substrate 100. Then, a disposable oxide layer 106 is formed on the first nitride layer 104 to a thickness of 3000~5000 Å via Chemical Vapor Deposition (CVD).

Figure 2:
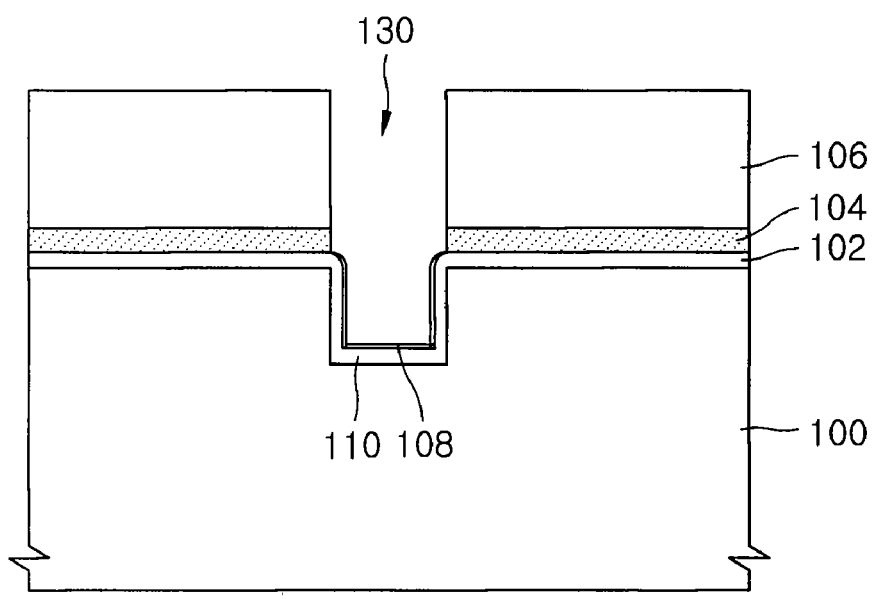

Referring to FIG. 2, a photoresist pattern (not shown) for etching the semiconductor substrate 100 is formed on the disposable oxide layer 106. Then, patterning for etching the semiconductor substrate 100 is performed, thereby forming a trench 130 within the semiconductor substrate 100. Subsequently, a channel oxide layer 110 is formed to a thickness of 50~150 Å along the inside of the trench 130 via thermal oxidation or CVD. A metal layer such as TiN or TaN is deposited on the channel oxide layer 110 to a thickness of 200 Å or less, thereby forming the reverse program preventing layer 108.

Figure 3:
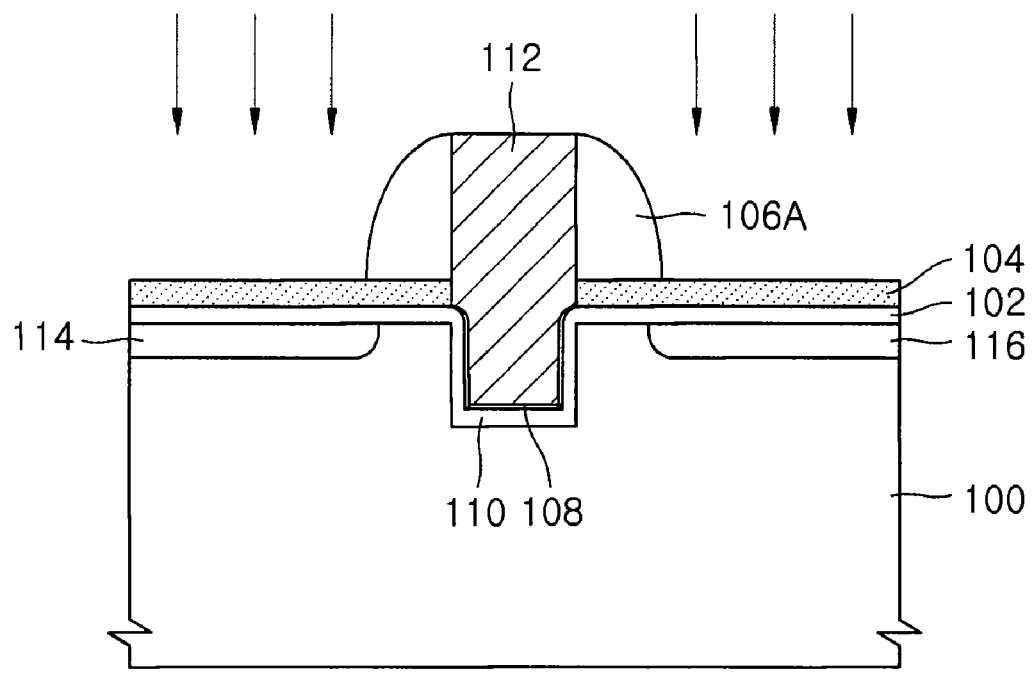

Referring to FIG. 3, a polysilicon layer 112 doped with an impurity is deposited on the semiconductor substrate 100 on which the reverse program preventing layer 108 is formed, and planarization is performed using the disposable oxide layer 106. Planarization may employ, for example, Chemical mechanical Polishing (CMP) or etchback. Thereafter, the disposable oxide layer 106 is anisotropically dry-etched to form spacers 106A composed of the disposable oxide layer 106 on both sides of the polysilicon layer 112 for the control gate. Then, using the control gate 112 and the spacers 106A as ion implantation masks, P or As is implanted to form the source/drain regions 116/114.

Figure 4:
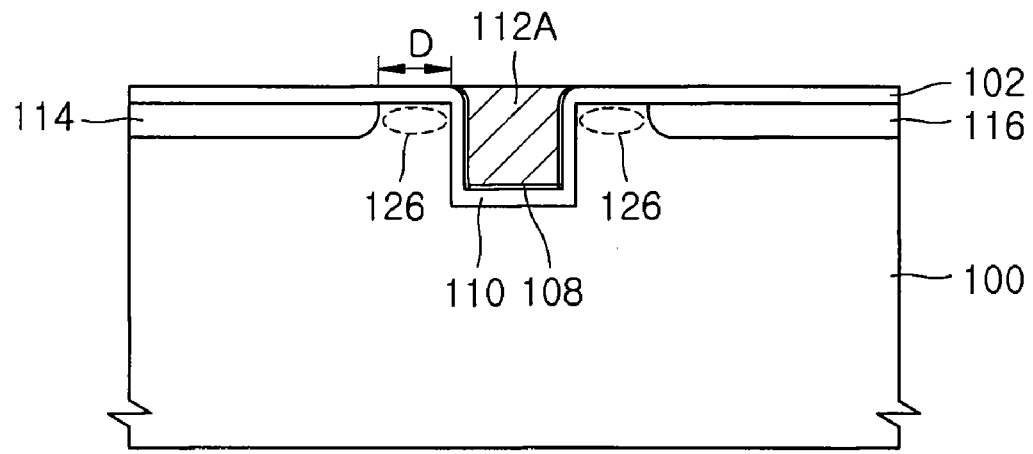

Referring to FIG. 4, the spacer 106A is removed, and the portion of the polysilicon layer 112 for the control gate that protrudes over the semiconductor substrate 100 is removed. Then, the first nitride layer 104 that is exposed on the surface of the semiconductor substrate 100 is removed. In another approach, an oxide layer or a photoresist layer is deposited on the semiconductor substrate 100 with the spacer 106A thereon. Thereafter, CMP using the first nitride layer 104 as a polishing stop layer may be performed to remove the spacer 106A on the upper portion of the semiconductor substrate 100 and the polysilicon layer 112 for the control gate.

By doing so, the source and drain regions 116 and 114 are uniformly spaced apart from the control gate 112A by a prescribed distance D. The distance D of the spacing of the source/drain regions 116 and 114 may be changed by adjusting the width of the spacer 106A, for example by the deposit thickness of the disposable oxide layer 106.

The polysilicon layer 112A for the control gate may optionally be partially removed to slightly protrude from the semiconductor substrate 100. The height of the protrusion is preferably lower than a half of the height formed on the trench.

Subsequently, formation of the nitride region or the impurity region is selectively carried out in the region designated by 126. Here, $N_2$ annealing or ion implantation with P or As ions may be performed to control the initial threshold voltage of the memory cell transistor to reduce to below 1 volt from an initial value of 1.5~1.8 volts. Accordingly, because the threshold voltage is lowered, reduction of endurance characteristics of the memory cell that otherwise would result from degradation of the tunnel oxide layer can be mitigated.

Figure 5:
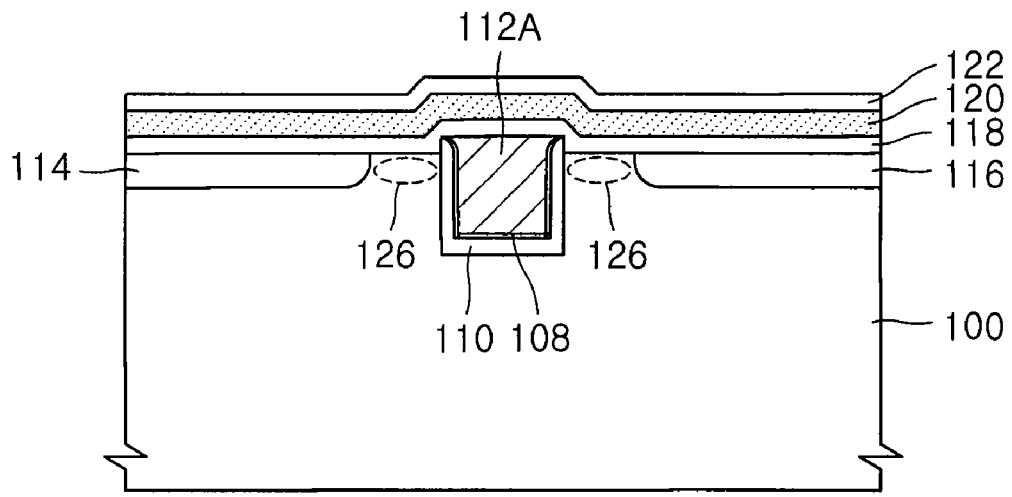

Referring to FIG. 5, the first oxide layer 102 on the semiconductor substrate 100 is removed. Then, a tunnel oxide layer 118 is formed on the semiconductor device 100 to a thickness of 28~70 Å. The tunnel oxide layer 118 may be composed of an oxide layer, or a single layer selected from SiN, SiON and high dielectric constant oxide or a multiple layer including at least one of these for enhancing program efficiency. The high dielectric constant oxide (high-K oxide) is any one material selected from a group consisting of Al oxide, Zr oxide, Hf oxide and La oxide. It is appropriate that the high dielectric constant oxide includes nitrogen within the layer when depositing a thin film via atomic layer deposition.

A charge trapping layer 120 is next formed on the tunnel oxide layer 118. The charge trapping layer 120 may be formed of a single layer or a multiple layer including at least one material selected from a group consisting of SiN, oxide, SiON and high dielectric constant oxide. When the layer has a sandwiched structure formed by alternately stacking a nitride layer and a high dielectric constant oxide including nitrogen, programming efficiency is increased in the charge trapping layer 120. Therefore, overall programming efficiency with respect to the charge trapping layer 120 can be increased. Preferable thickness of the charge trapping layer 120 is 40~120 Å.

A blocking oxide layer 122 is next formed on the charge trapping layer 120. The blocking oxide layer 122 may be composed of a multiple layer consisting of a material selected from thermal oxide, $N_2O$ annealed CVD oxide, and an insulating layer composed of SiON, which has a thickness of 28~140 Å. The oxide layer used as the blocking oxide layer 122 may use Medium Temperature Deposition oxide (MTO) formed in a temperature range of 450~800° C. via CVD.

Referring to FIG. 6, a conductive layer for a word gate is deposited on the semiconductor substrate 100 on which the blocking oxide layer 122 is formed. Subsequently, patterning with respect to the conductive layer is performed to form a word gate 124 that is oriented so as to cross over the control gate 112A. Though not illustrated in the drawing, the configuration may be modified by adding a metal layer composed of a material that constitutes the reverse program preventing layer 108 with a work function smaller than that of silicon between the blocking oxide layer 122 and the word gate 124, thereby improving the reliability of the memory cell during a programming operation.

The word gate 124 may be composed of a single layer or a multiple layer composed of a material selected from a group consisting of polysilicon, TaN, NiTa, Ti, TiN, W, WN, Hf, Mo, Ir, Pt, Co, Cr, $RuO_2$ and $Mo_2N$.

Second Embodiment

1-Bit Non-Volatile Memory Device in the second embodiment, the source region and drain region are asymmetrically formed to employ a charge trapping layer disposed on only the drain region 214 as a charge storage space. Except for this portion, the construction and fabricating method are identical to those of the first embodiment. Accordingly, a detailed description with respect to the similar parts and steps is omitted for evading repetition.

Figure 8:
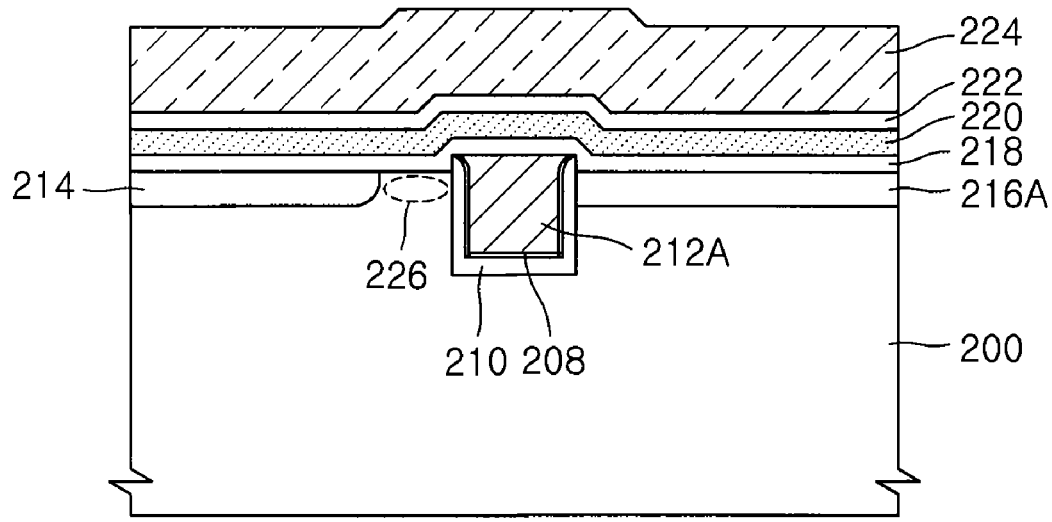

Referring to FIG. 8, the structure of the non-volatile memory device with the buried control gate according to the second embodiment of the present invention will now be described.

The non-volatile memory device includes a semiconductor substrate 200 with a device isolation region, and a control gate 212A disposed within a trench formed in the semiconductor substrate 200. A drain region 214 disposed in the semiconductor substrate 200 spaced apart from one side of the control gate 212A by a prescribed distance, and a source region 216A formed in the semiconductor substrate 200 adjacent to the other side of the control gate 212A. Also, a tunnel oxide layer 218, a charge trapping layer 220 and a blocking oxide layer 222 cover the semiconductor substrate 200. Then, a word gate 224 is formed on the blocking oxide layer 222 in an orientation so as to be over the control gate 212A. A channel oxide layer 210 and a reverse program preventing layer 208 are selectively interposed between the trench and the control gate 212A. In order to improve endurance characteristics, a nitride region or an impurity region 226 for controlling a threshold voltage may be added between the control gate 212A and the drain region 214.

A method of operating the non-volatile memory device having the buried control gate according to the present invention will now be described.

First, in a programming operation, Channel Hot Electron Injection is used and the source region is grounded, the control gate is supplied with 1.5 volts, the word gate is supplied with 5 volts, and the bit line connected to the drain region is supplied with 5 volts.

In connection with a memory cell read operation, the source region is supplied with 0.8~1.6 volts, the control gate is supplied with 1.5~3 volts, the word gate is supplied with 3 volts, and the bit line connected to the drain region is grounded, thereby reading out the information stored in the memory cell.

An erase operation for the memory cell utilizes Hot Hole Erasing, in which the source region and the control gate are grounded or floated, the word gate is supplied with −5~−8 volts, and the drain region is supplied with 5~8 volts.

The non-volatile memory device having the buried control gate according to this embodiment of the present invention also enables multi-level cell operation, as in the first embodiment, of which description will thus be omitted for evading repetition.

Figure 7:
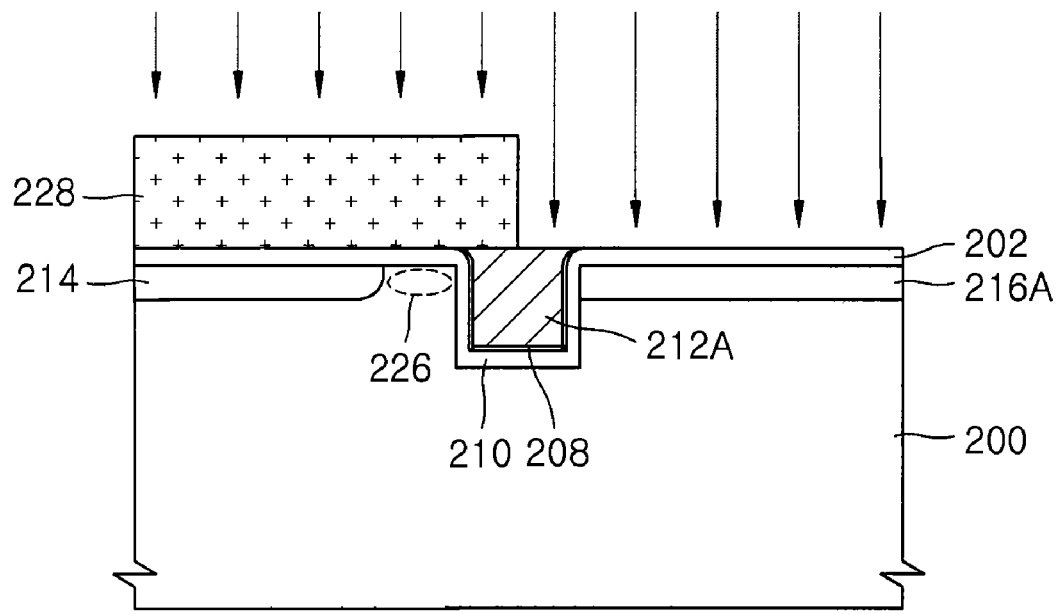
FIGS. 7 and 8 are sectional views of the non-volatile memory device having a buried control gate and a method of fabricating the same according to a second embodiment of the present invention.

Referring to FIGS. 7 and 8, a method of fabricating the non-volatile memory device with the buried control gate according to the second embodiment will be described.

The process illustrated above is identical to that of the first embodiment through FIG. 4, which will thus be omitted.

Referring to FIG. 7, a photoresist pattern 228 to be used as an ion implantation mask is formed on the semiconductor substrate that has already been subjected to $N_2$ annealing or ion implanting with respect to the impurity region 226 between the control gate 212A and the drain region 214. Then, ion implantation is performed to allow the source region 216A to be formed adjacent to the control gate 212A.

Referring to FIG. 8, the first oxide layer 202 remaining on the semiconductor substrate 200 is removed. Similar to the above-described first embodiment, the tunnel oxide layer 218, the charge trapping layer 220 and the blocking oxide layer 222 are sequentially formed. Then, the word gate 224 is formed on the blocking oxide layer 222 at an orientation so as to cross over the control gate 212A.

In conclusion, because the charge trapping layer is formed on both sides of the control gate in a self-aligned manner In the embodiments of the present invention so as to uniformly maintain the length of the charge trapping layer, Memory Cell Threshold Voltage (Vth) uniformity can be improved. Secondly, the effective channel length of the control gate is increased to restrain punchthrough, thereby improving reliability during memory cell operation. Furthermore, multi-level cell operation is adopted to increase the amount of data that can be stored in a unit memory cell, which is favorable for achieving high capacity.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of fabricating a non-volatile memory device with a buried control gate comprising:
   sequentially stacking a first oxide layer, a first nitride layer and a disposable oxide layer on a semiconductor substrate;
   patterning the semiconductor substrate with the disposable oxide layer thereon to form a trench by partially etching the semiconductor substrate, and forming a channel oxide layer within the trench;
   depositing a polysilicon layer for a control gate on the channel oxide layer by filling the trench and planarizing the polysilicon layer;

forming a spacer using the disposable oxide layer at a side of the polysilicon layer;

forming source/drain regions in the semiconductor substrate via ion implanting, using the spacer as a mask;

removing the spacer, an upper portion of the polysilicon layer, the first nitride layer and the first oxide layer disposed on the semiconductor substrate;

sequentially forming a tunnel oxide layer, a charge trapping layer, and a blocking oxide layer on the semiconductor substrate and a remaining lower portion of the polysilicon layer comprising the control gate; and forming a word gate on the blocking oxide layer.

2. The method of claim 1, after the forming the channel oxide layer within the trench, further comprising forming a metal layer on the channel oxide layer for preventing reverse programming on the channel oxide layer.

3. The method of claim 1, wherein removing the polysilicon for the control gate is performed so that the remaining lower portion of the polysilicon layer for the control gate has a prescribed height above an upper surface of the semiconductor substrate.

4. The method of claim 3, wherein the height of the polysilicon layer for the control gate that is above the upper surface of the semiconductor substrate is less than half of a height of a portion of the polysilicon layer that is buried in the trench.

5. The method of claim 1, after removing the first oxide layer, further comprising performing an $N_2$ annealing process on a region of the semiconductor substrate between the control gate and the source/drain regions, for controlling a threshold voltage of the device.

6. The method of claim 5, wherein the $N_2$ annealing process for controlling a threshold voltage lowers the threshold voltage from a range of 1.5~1.8 volts to 1 volt, or less.

7. The method of claim 1, after removing the first oxide layer, further comprising performing an ion implanting process on a region of the semiconductor substrate between the control gate and the source/drain regions, for controlling a threshold voltage of the device.

8. The method of claim 7, wherein the ion implanting process for controlling the threshold voltage lowers the threshold voltage from a range of 1.5~1.8 volts to 1 volt, or less.

9. The method of claim 1, after the forming the word gate, further comprising connecting the polysilicon layer for the control gate to the word gate.

10. A method of fabricating a non-volatile memory device with a buried control gate comprising:

sequentially stacking a first oxide layer, a first nitride layer and a disposable oxide layer on a semiconductor substrate;

patterning the semiconductor substrate with the disposable oxide layer thereon to form a trench by partially etching the semiconductor substrate, and forming a channel oxide layer within the trench;

depositing a polysilicon layer for a control gate on the channel oxide layer by filling the trench and planarizing the polysilicon layer;

forming a spacer using the disposable oxide layer at a side of the polysilicon layer;

forming source/drain regions in the semiconductor substrate via ion implanting, using the spacer as a mask;

removing the spacer, an upper portion of the polysilicon layer and the first nitride layer disposed on the semiconductor substrate;

depositing a photoresist layer on the drain region, and ion implanting the source region to be adjacent to the polysilicon layer for the control gate;

removing the first oxide layer;

sequentially forming a tunnel oxide layer, a charge trapping layer, and a blocking oxide layer on the semiconductor substrate and a remaining lower portion of the polysilicon layer comprising the control gate; and forming a word gate on the blocking oxide layer.

11. The method of claim 10, after the forming the channel oxide layer within the trench, further comprising forming a metal layer on the channel oxide layer for preventing reverse programming on the channel oxide layer.

12. The method of claim 10, after removing the first oxide layer, further comprising performing an $N_2$ annealing process on a region of the semiconductor substrate between the control gate and the drain region for controlling a threshold voltage of the device.

13. The method of claim 12, wherein the $N_2$ annealing process for controlling a threshold voltage lowers the threshold voltage from a range of 1.5~1.8 volts to 1 volt, or less.

14. The method of claim 10, after removing the first oxide layer, further comprising performing an ion implanting process on a region of the semiconductor substrate between the control gate and the drain region for controlling a threshold voltage of the device.

15. The method of claim 14, wherein the ion implanting process for controlling a threshold voltage lowers the threshold voltage from a range of 1.5~1.8 volts to 1 volt, or less.

16. The method of claim 10, after the forming the word gate, further comprising connecting the polysilicon layer for the control gate to the word gate.

* * * * *